United States Patent
Shannon et al.

(10) Patent No.: US 7,813,103 B2
(45) Date of Patent: Oct. 12, 2010

(54) TIME-BASED WAFER DE-CHUCKING FROM AN ELECTROSTATIC CHUCK HAVING SEPARATE RF BIAS AND DC CHUCKING ELECTRODES

(75) Inventors: Steven C. Shannon, Raleigh, NC (US); Michael G. Chafin, Santa Clara, CA (US); Dennis S. Grimard, Ann Arbor, MI (US)

(73) Assignee: Applied Materials, Inc., Santa Clara, CA (US)

( * ) Notice: Subject to any disclaimer, the term of this patent is extended or adjusted under 35 U.S.C. 154(b) by 448 days.

(21) Appl. No.: 11/974,502

(22) Filed: Oct. 11, 2007

(65) Prior Publication Data

US 2009/0097185 A1  Apr. 16, 2009

(51) Int. Cl.
H02N 13/00 (2006.01)
H01T 23/00 (2006.01)
(52) U.S. Cl. .................................................... 361/234
(58) Field of Classification Search .................. 361/234
See application file for complete search history.

(56) References Cited

U.S. PATENT DOCUMENTS

| | | | |
|---|---|---|---|
| 5,491,603 A * | 2/1996 | Birang et al. ............... 361/234 |
| 5,612,850 A | 3/1997 | Birang et al. ............... 361/234 |
| 5,684,669 A | 11/1997 | Collins et al. ............... 361/234 |
| 5,818,682 A | 10/1998 | Loo ............................ 361/234 |
| 5,900,062 A | 5/1999 | Loewenhardt et al. .. 118/723 R |
| 5,946,184 A * | 8/1999 | Kanno et al. ................. 361/234 |
| 6,005,376 A * | 12/1999 | Mett et al. .................... 323/281 |
| 6,125,025 A | 9/2000 | Howald et al. ............... 361/234 |
| 6,198,616 B1 * | 3/2001 | Dahimene et al. ........... 361/234 |
| 6,236,555 B1 | 5/2001 | Leeser ......................... 361/234 |
| 6,243,251 B1 * | 6/2001 | Kanno et al. ................. 361/234 |
| 6,304,424 B1 * | 10/2001 | Mett et al. .................... 361/234 |
| 6,673,636 B2 * | 1/2004 | Ma ................................ 438/14 |
| 7,247,218 B2 | 7/2007 | Hoffman ............... 156/345.28 |
| 2004/0115418 A1 | 6/2004 | Anderson et al. ........ 428/308.4 |

* cited by examiner

*Primary Examiner*—Ronald W Leja
(74) *Attorney, Agent, or Firm*—Law Office of Robert M. Wallace

(57) ABSTRACT

An electrostatic chuck in a reactor chamber has a cathode electrode insulated from ground, a chucking electrode insulated from the cathode electrode and a dielectric layer overlying the chucking electrode that provides a workpiece support surface. A D.C. chucking voltage supply is coupled to the chucking electrode. An RF power generator is coupled to the cathode electrode. A voltage sensing apparatus is coupled to the chucking electrode and to the cathode electrode to monitor the voltage difference between them during discharge after removal of RF and DC power at the conclusion of processing. The reactor includes a controller programmed to raise the lift pins during electrode discharge as soon as the voltage sensing apparatus detects equal voltages simultaneously on the chucking and cathode electrodes.

20 Claims, 5 Drawing Sheets

TIME-BASED WAFER DE-CHUCKING FROM AN ELECTROSTATIC CHUCK HAVING SEPARATE RF BIAS AND DC CHUCKING ELECTRODES

BACKGROUND

Electrostatic chucks are used for holding a workpiece in various applications ranging from holding a sheet of paper in a computer graphics blotter to holding a semiconductor wafer within a semiconductor fabrication process system. Although electrostatic chucks vary in design, they all are based on the principle of applying a voltage to one or more electrodes in the chuck so as to induce opposite polarity charges in the workpiece and electrode(s), respectively. The electrostatic attractive force between the opposite charges presses the workpiece against the chuck, thereby retaining the workpiece.

A problem with electrostatic chucks is the difficulty of removing the electric charge from the workpiece and the chuck when it is desired to release the workpiece from the chuck. One conventional solution is to connect both the electrode and the workpiece to ground to drain the charge. However, the charge trapped into the dielectric material cannot be drained freely. Another conventional solution, which purportedly removes the charge more quickly, is to reverse the polarity of D.C. voltage applied to the electrodes.

A shortcoming that has been observed with these conventional approaches to removing the electric charge is that they fail to completely remove the charge, so that some electrostatic force remains between the workpiece and the chuck. This residual electrostatic force necessitates the use of a large mechanical force to separate the workpiece from the chuck. When the workpiece is a semiconductor wafer, the force required for removal sometimes cracks or otherwise damages the wafer. Even when the wafer is not damaged, the difficulty of mechanically overcoming the residual electrostatic force sometimes causes the wafer to pop off the chuck unpredictably into a position from which it is difficult to retrieve by a conventional wafer transport robot. Wafer de-chucking is critical since it can impact particle generation and tool utilization should a wafer be broken or misplaced to the point where it requires that the chamber be opened to retrieve the wafer. These problems may be addressed by applying a de-chucking voltage to the chucking electrode to reduce or remove any residual electrostatic force holding the wafer when de-chucking the wafer. Determining the optimum de-chucking voltage is difficult.

The optimum de-chucking voltage provides for wafer lift-off without popping or significant robot corrections. Typically, an optimum de-chuck voltage is highly dependent upon the wafer characteristics and the plasma process conditions and the temperature of the electrostatic chuck.

The approach of the prior art was to apply a special de-chucking voltage when lifting off the wafer in order to counteract the residual chucking force and thereby avoid wafer breakage.

The foregoing methods are limited because the application and determination of an optimum de-chucking voltage varies among different plasma process conditions and different wafer designs and different electrostatic chuck designs. What is generally desired now is a de-chucking method that minimizes the residual chucking force upon wafer lift-off, regardless of variations in plasma process conditions, wafer characteristics and electrostatic chuck properties.

SUMMARY

A plasma reactor is provided for processing a workpiece. In one aspect, the reactor includes a vacuum chamber including an RF grounded chamber wall and a process gas disperser coupled to the chamber. An electrostatic chuck is disposed in the chamber and includes a cathode electrode insulated from ground. A chucking electrode overlies the cathode electrode and is insulated from the cathode electrode. A dielectric layer overlies the chucking electrode, wherein the dielectric layer has a top surface that can support a workpiece to be processed and lift pins. A D.C. chucking voltage supply is coupled to the chucking electrode. An RF power generator is coupled through the RF impedance match to the cathode electrode. Voltage sensing apparatus is coupled to the chucking electrode and to the cathode electrode to monitor the voltage difference between them during discharge and after removal of RF and DC power at the conclusion of plasma processing. The reactor further includes a controller programmed to raise the lift pins during electrode discharge as soon as the voltage sensing apparatus detects equal voltages simultaneously on the chucking and cathode electrodes.

A first D.C. discharge path having a first resistance is provided through the D.C. chucking voltage supply from the chucking electrode to ground. A second D.C. discharge path having a second resistance is provided through the RF impedance match from the cathode electrode to ground. The first and second resistances provide unequal electrical discharge time constants in the first and second D.C. discharge paths to ensure a crossover of the two electrode voltages during discharge. The chucking electrode typically has the higher initial voltage at the beginning of discharge and therefore its discharge path is provided with the faster (smaller) RF time constant.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

There is data indicating the relationship between the D.C. power supply current spikes observed during chucking or de-chucking and the optimum de-chucking voltage. It is observed that a D.C. current spike is seen at the D.C. chucking supply when the wafer is placed on or removed from the electrostatic chuck. For the spike observed during wafer chucking, it is believed the spike arises from the accumulation of charge in the electrostatic chuck insulator layer separating the wafer from the chucking electrode. When the plasma and D.C. chucking voltage are turned off at the end of wafer processing, this charge remains, and is the likeliest source of a residual chucking force holding the wafer to the chuck.

Figure 1:
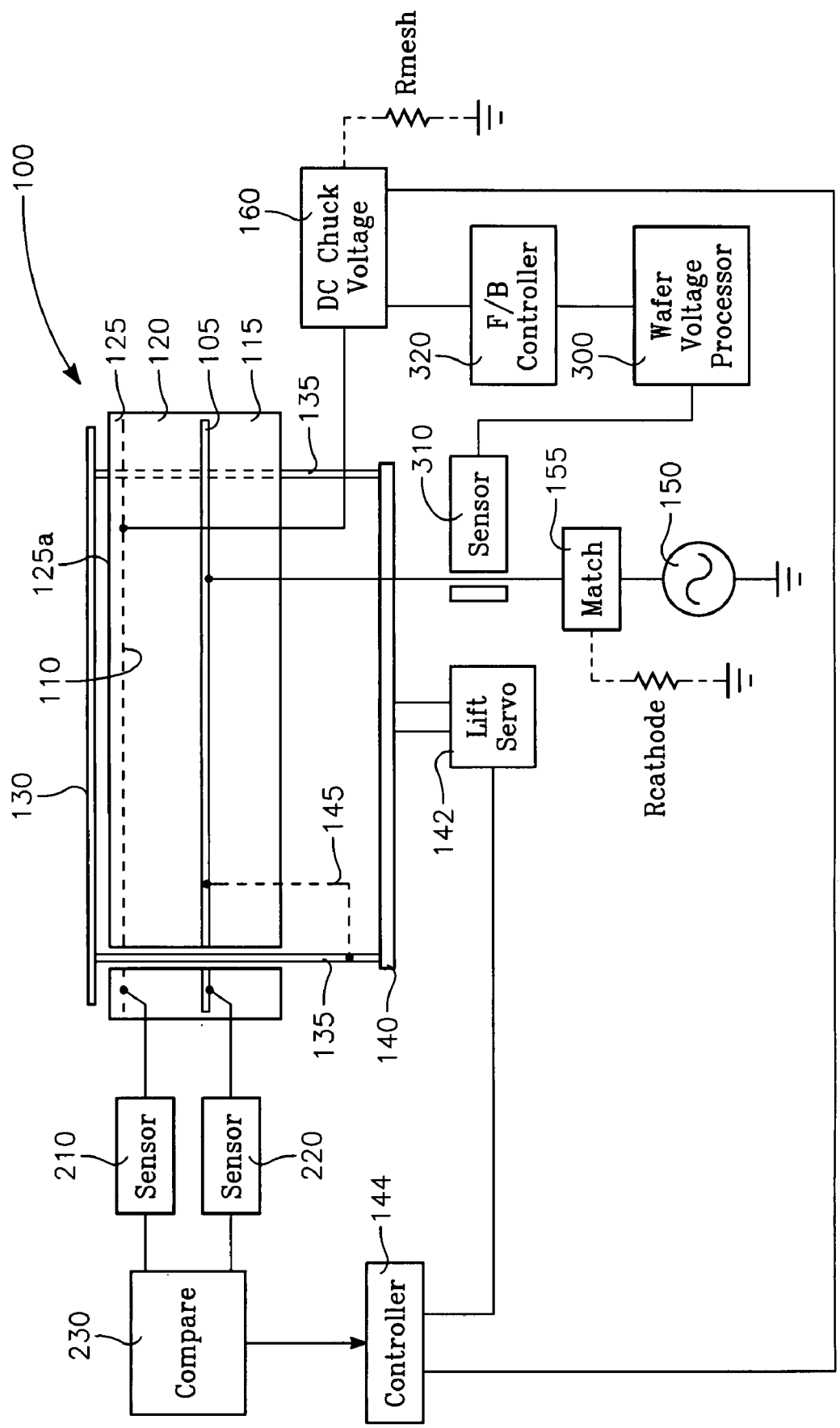
FIG. 1 depicts an electrostatic chuck (ESC) in accordance with one embodiment.
Figure 2:
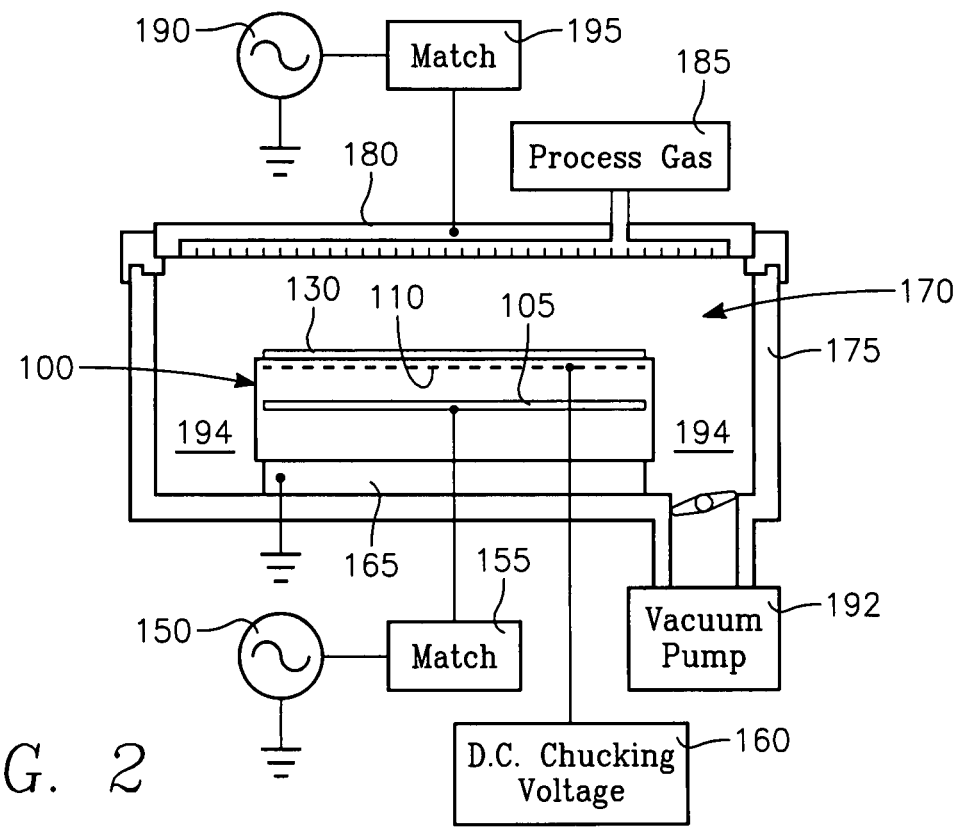
FIG. 2 depicts a capacitively coupled plasma reactor with the ESC of FIG. 1.
Figure 3:
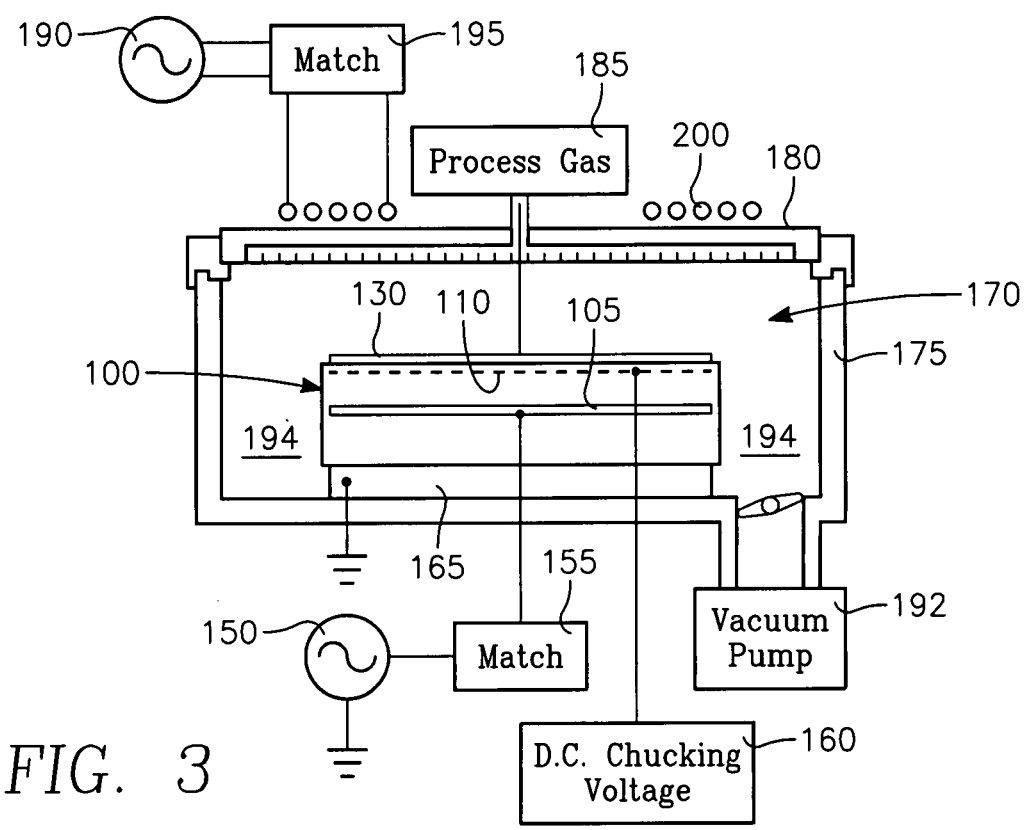
FIG. 3 depicts an inductively coupled plasma reactor with the ESC of FIG. 1.

FIG. 1 illustrates an electrostatic chuck (ESC) 100 for electrostatically clamping in place a workpiece such as a semiconductor wafer during processing in a plasma reactor chamber. FIG. 2 depicts the deployment of the ESC 100 of FIG. 1 in a capacitively coupled plasma reactor chamber and FIG. 3 depicts the deployment of the ESC 100 of FIG. 1 in an inductively coupled plasma reactor chamber. The ESC of FIG. 1 is of the type having an RF-"hot" (floating) cathode 105 for coupling RF bias power into the chamber and a separate chucking electrode 110 for coupling a D.C. chucking voltage to the wafer. The chucking electrode 110 may be a thin conductor or mesh structure. The ESC of FIG. 1 includes an insulating or dielectric base layer 115 underlying the cathode 105. An intermediate dielectric layer 120 separates and insulates the cathode 105 and chucking electrode 110 from one another. A very thin top dielectric layer 125 overlying the chucking electrode 110 has a top surface 125a on which a workpiece such as a semiconductor wafer 130 may be held during plasma processing in the chamber. The wafer 130 is lowered onto the support surface 125a and raised from the support surface 125a by a set of electrically conductive lift pins 135 supported on a movable lift spider 140, which may also be electrically conductive. A lift servo 142 raises and lowers the lift spider 140 under control of a programmable controller 144. The controller 144 also controls the D.C. chucking voltage supply 160, so that the controller 144 can govern the wafer chucking and de-chucking operation. The lift pins 135 are electrically connected to the floating cathode 105 (as indicated schematically in FIG. 1 by the dashed line wire 145). In this way, there is no potential difference between the lift pins 135 and the cathode 105, thereby permitting the lift pins 135 to be at least partially raised (e.g., to the position depicted in FIG. 1) without risk of arcing between the lift pins 135 and the cathode 105. RF bias power is applied to the cathode 105 from an RF bias power generator 150 through an RF impedance match circuit 155. The bias power may contribute significantly to ion energy in the plasma sheath, and the RF bias power generator 150 may have a frequency lying in the LF to HF frequency range, or sufficiently low for ions to follow the oscillations of the bias power.

A D.C. wafer chucking voltage is applied to the chucking electrode 110 from a D.C. voltage source 160 to produce a desired electrostatic clamping force on the wafer 130. The insulator layer 125 lying between the chucking electrode 110 and the wafer 130 has a limited conductance, e.g., a resistance on the order of 30 megaOhms. This promotes charge mobility in the thin insulator layer 125 (and a low D.C. current through the insulator layer 125) in the manner of a Johnson-Raybeck ESC, so that static charge induced by a D.C. chucking voltage from the D.C. supply 160 is free to move through the insulator layer 125 to accumulate at the surface facing the wafer 130. The resulting close proximity of the static charge in the insulator layer 125 to the wafer 130 greatly increases the electrostatic clamping force for a given D.C. chucking voltage, thereby reducing the chucking voltage required to attain a desired electrostatic clamping force.

In the reactor of FIG. 2, the ESC 100 is inside the chamber 170 of a capacitively coupled plasma reactor, the chamber 170 defined by a cylindrical side wall 175 and an overhead ceiling electrode/gas distribution plate 180. Optionally, the ESC 100 is separated from the floor of the chamber enclosure by a layer 165 which may be a metal or a dielectric material. A process gas supply 185 provides process gas to the ceiling electrode/gas distribution plate 180. An RF plasma source power generator 190 provides RF plasma source power to the overhead electrode 180 through an RF impedance match element 195. For efficient production of ions, the frequency of the RF plasma source power generator may be a VHF frequency. A vacuum pump 192 evacuates the chamber 170 through a pumping annulus 194 defined between the ESC 100 and the side wall 175.

In the reactor of FIG. 3, the ESC 100 is inside the chamber 170 of an inductively coupled plasma reactor, the chamber 170 defined by a cylindrical side wall 175. A process gas supply 185 provides process gas for injection into the chamber. An RF plasma source power generator 190 provides RF plasma source power to an overhead coil antenna 200 through an RF impedance match element 195. For an inductively coupled source, the RF plasma source power generator may be an HF frequency, for example. A vacuum pump 192 evacuates the chamber 170 through a pumping annulus 194 defined between the ESC 100 and the side wall 175.

Figure 4:
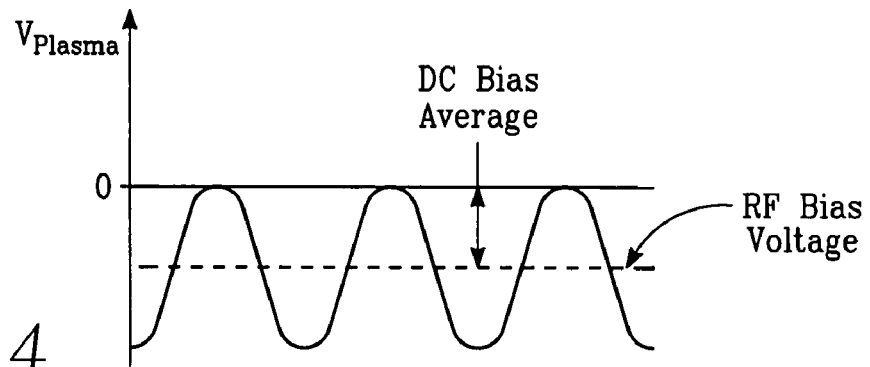
FIG. 4 depicts the time domain waveform of the plasma electric potential.

In the reactor of FIG. 2 and in the reactor of FIG. 3, the RF source power coupled into the chamber from the source power generator 190 produces plasma ions. The voltage of the plasma relative to ground follows an RF waveform as depicted in FIG. 4. If only the source power generator 190 is active, then the waveform of the plasma voltage of FIG. 4 is a sine wave having a frequency equal to that of the source power generator 190. If only the bias power generator 150 is active, then the waveform of the plasma voltage of FIG. 4 is a sine wave having a frequency equal to the frequency of the bias power generator 150. If both generators 150, 190 are active, then the plasma voltage may be a composite waveform, depending upon the frequencies of the two RF generators 150, 190. In the absence of the source power generator 190, plasma ions are generated by the RF power applied from the RF generator 150 to the cathode 105. In this case, the plasma voltage relative to ground oscillates with the RF voltage from the RF generator 150.

Ions in the plasma, which have a large mass-to-charge ratio, do not easily follow the oscillation of the plasma voltage of FIG. 4, while the electrons do follow the oscillation. During the least negative portions of the plasma voltage waveform of FIG. 4, plasma electrons flow from the plasma to the wafer 130 (and other portions of the chamber) across a sheath or boundary between the plasma and interior surfaces such as the surface of the wafer 130. Ion flux across the sheath does not appreciably change over the cycles of the plasma voltage of FIG. 4. The oscillating plasma voltage waveform of FIG. 4 has a negative D.C. component (referred to as an RF bias voltage) arising from a negative sheath charge on all plasma-exposed surfaces in the chamber, this charge being equivalent to the volume electron charge loss generated in the sheath.

Figure 5:
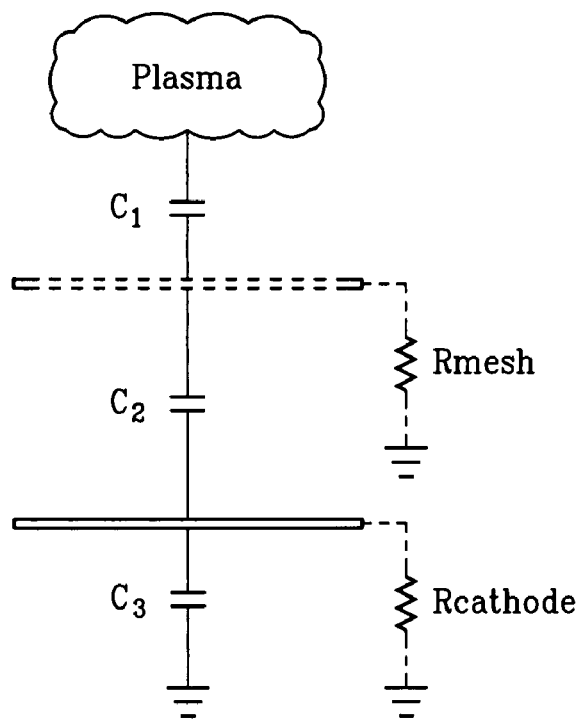
FIG. 5 is a schematic diagram of an equivalent circuit corresponding to the ESC of FIG. 1.

FIG. 5 depicts a simplified equivalent circuit or model of the ESC 100 of FIG. 1. The RF bias voltage (or D.C. component) of the RF plasma potential of FIG. 4 creates voltage drops across all impedance components between the plasma and ground. In the equivalent circuit of FIG. 5, these components are modeled as capacitances in series. In FIG. 5, the capacitance across the plasma sheath between the plasma and the wafer 130 is labeled C1. The capacitance across the insulator layer 125 is so great (due to the thinness of this layer) that the RF voltage drop across the insulator layer 125 is negligible, and therefore this capacitance is not modeled in the equivalent circuit of FIG. 5. The capacitance across the insulator layer 120 between the chucking electrode 110 and the cathode 105 is labeled C2 in FIG. 5. The capacitance between the cathode 105 and ground is labeled C3 in FIG. 5.

The RF voltage or electrical potential of the plasma (FIG. 4) produces a voltage on the chucking electrode 110 and on the wafer 130 in accordance with RF voltage drops across the capacitances C1, C2, C3 in the schematic model of FIG. 5. The RF voltage of the plasma (FIG. 4) has a D.C. component or bias voltage (labeled as such in FIG. 4) that contributes to the D.C. potentials of the wafer 130 and chucking electrode 110. Because of the negligible RF voltage drop across the thin insulator layer 125, the wafer 130 and chucking electrode 110 have essentially the same RF bias or D.C. component voltage. The D.C. chucking voltage from the D.C. supply 160 is superimposed on the bias voltage of the chucking electrode 110. The series of capacitances C1, C2, C3 act as RF voltage dividers so that a portion of the D.C. bias of the RF plasma voltage appears across the plasma-wafer sheath capacitance C1 (placing the chucking electrode 110 at a first D.C. potential) while another portion of the D.C. bias of the RF plasma voltage appears across the mesh-cathode capacitance C2 (placing the cathode 105 at a second D.C. potential generally closer to ground than the first potential). As a result, the chucking electrode 110 and the cathode 105 are at different D.C. bias voltage potentials during the plasma process. Any D.C. voltage applied by the D.C. chucking voltage supply 160 to the chucking electrode 110 contributes to this difference.

When the wafer 130 is to be de-chucked, or lifted off the ESC 100, the RF power generators 150, 190 are turned off or disconnected, the D.C. power supply 160 is turned off (or reduced) and the lift pins 135 are raised until they contact the wafer 130. The lift pins are at the voltage of the cathode 105, which is below the voltage of the wafer 130/chucking electrode 110 combination. Therefore, when the lift pins 135 contact the wafer 130, there is a current spike observed at the chucking voltage supply 160 determined by the cathode-to-mesh voltage difference, the mesh-to-cathode capacitance C2 and other factors. The magnitude of this spike is indicative of the residual clamping force existing at the time the RF power and DC voltage are removed.

Figure 6:
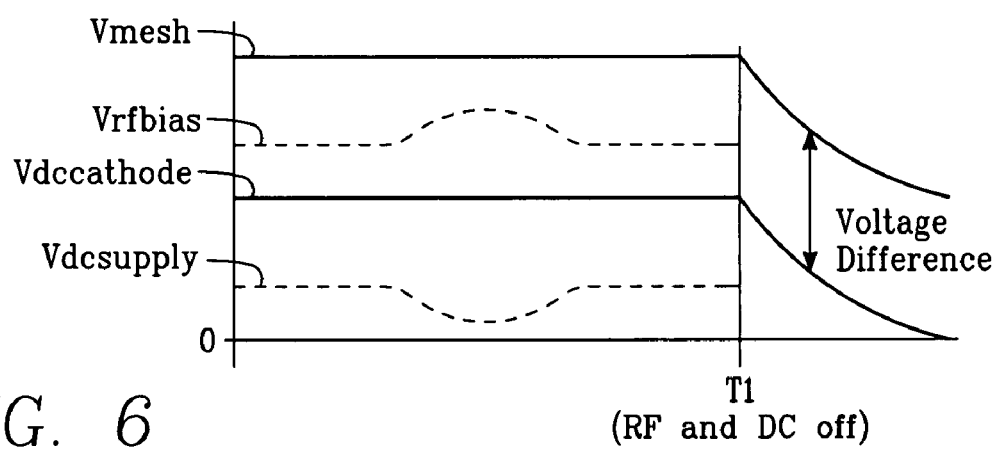
FIG. 6 depicts the time domain waveforms of the cathode and chucking electrode voltages in a conventional floating cathode ESC.

FIG. 6 illustrates contemporaneous waveforms of the chucking electrode voltage and the cathode voltage. The chucking electrode voltage is the sum of the bias or D.C. component of the RF voltage drop at the chucking electrode 110 ("Vrfbias" in FIG. 6) and the D.C. voltage output by the D.C. chucking voltage supply 160 ("Vdcsupply" in FIG. 6). Therefore, the voltage difference between the cathode 105 and chucking electrode 110 is attributable to both (a) the RF voltage difference between them and (b) the D.C. chucking voltage applied to the chucking electrode 110 by the D.C. supply 160. As depicted in the graph of FIG. 6, during plasma processing (from time 0 to time T1), the average or D.C. component of the voltage on the cathode 105 ("Vdccathode" in FIG. 6), is generally constant during plasma processing. During this same period, the RF bias or D.C. component of the voltage of the chucking electrode 110, Vrfbias, is fairly constant but (as indicated in FIG. 6) experiences fluctuations over time due to its closer proximity to the plasma. These fluctuations are relatively small, in that they do not generally cause the chucking electrode voltage to fall below the cathode voltage.

Optionally, for accurate control of the electrostatic clamping force, compensation for such fluctuations may be provided by varying the output of the D.C. supply 160 during plasma processing in a manner that complements the fluctuations in the D.C. component of the RF voltage on the wafer 130 or mesh 110. For this purpose, a wafer voltage measurement processor 300 constantly measures the RF bias (D.C. component) voltage on the wafer 130 (which is essentially the same as that of the chucking electrode 110), based upon output signals from a sensor 310 at the RF impedance match 155. Such a measurement may be made in accordance with U.S. patent application Ser. No. 10/440,364 filed May 16, 2003 by Daniel Hoffman entitled PLASMA DENSITY, ENERGY AND ETCH RATE MEASUREMENTS AT BIAS POWER INPUT AND REAL TIME FEEDBACK CONTROL OF PLASMA SOURCE AND BIAS POWER and assigned to the present assignee. A feedback controller 320 uses the output of the wafer voltage processor 300 to vary the output level of the D.C. voltage supply 160 so as to compensate for fluctuations in the RF bias voltage and thereby maintain a more constant chucking electrode voltage. An example of such compensation is depicted in dashed line in FIG. 6. As stated above, the dashed line curve labeled in FIG. 6 "Vrfbias" is the D.C. component of the RF voltage on the chucking electrode 110 (which is about the same as that on the wafer 130) as sensed by the measurement processor 300. The dashed line curve labeled "Vdcsupply" in FIG. 6 is the output of the D.C. supply 160. The sum of Vrfbias and Vdcsupply is the D.C. voltage on the chucking electrode 110 ("Vmesh" of FIG. 6). Vmesh is constant because of the offsetting variations in Vrfbias and Vdcsupply.

Referring again to FIG. 6, the voltages on the cathode 105 and chucking electrode 110, namely Vcathode and Vmesh, decay after the removal of RF power and removal of the D.C. chucking voltage at time T1. A voltage difference between them possibly can persist for an indefinite period of time, as indicated in the example depicted in the graph of FIG. 6. This voltage difference produces a residual wafer clamping force that can prevent safe de-chucking or lift-off of the wafer 130 from the ESC 100 by the lift pins 135. The delay represented by the persistence of this voltage difference impairs throughput and productivity.

An accurate method for de-chucking the wafer 130 with a minimum (or zero) residual chucking force is provided. One element of this method involves a selection of the D.C. discharge path characteristics (i.e., electrical discharge times) of the two electrodes 105, 110. This selection is made by providing a selected resistance to ground for the cathode 105 through the RF impedance match 155, and by providing a selected resistance to ground for the chucking electrode 110 through the D.C. voltage supply 160. These resistances are indicated schematically in dashed line in FIG. 1, including a resistance Rcathode through the RF impedance match 155 and a resistance Rmesh through the D.C. supply 160. In addition, the selection of the discharge characteristics of the cathode 105 and chucking electrode 110 may further involve a selection of the capacitance of the chucking electrode 110 and a selection of the capacitance of the cathode 105 (among other things).

Figure 7:
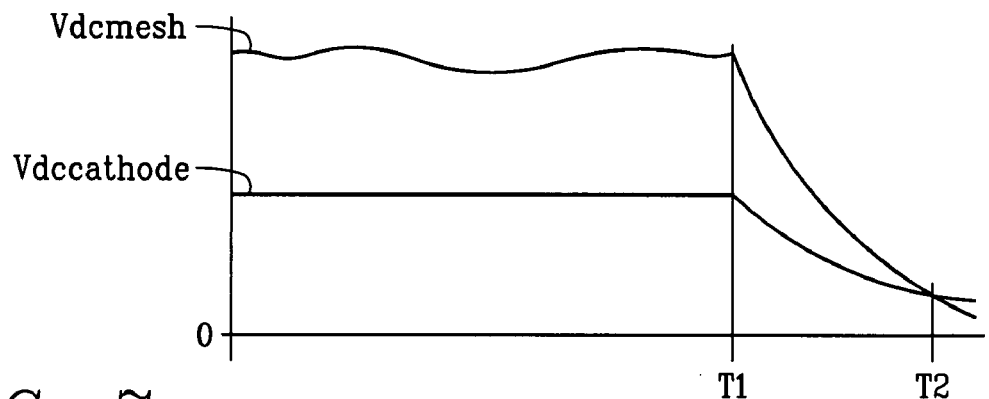
FIG. 7 depicts the time domain waveforms of the cathode and chucking electrode voltages in the embodiment of FIG. 1.

The resistances Rcathode and Rmesh, along with the mesh-to-cathode capacitance C2 and the cathode-to-ground capacitance C3, determine the RC decay constants for each of the electrodes 105, 110 (controlling the discharge that occurs after time T1 of FIG. 6) such that their exponentially decaying voltages will cross over one another for a brief instant at some time after T1. The situation is depicted in the graph of FIG. 7. As shown in FIG. 7, the voltage of the chucking electrode 110 at time T1 starts out higher than the voltage of the cathode 105 at time T1. Their RC exponential decay time constants, RcathodeC3 and RmeshC2, are selected so that the chucking electrode voltage (which is initially the higher of the two) decays faster than the cathode voltage beginning at time T1. This condition enables the two voltages to cross over one another (become equal to one another for a brief instant in time) at time T2. The interval from time T1 to time T2 is determined by the difference between the RC exponential decay time constants of the cathode 105 and the chucking electrode 110. Specifically, in one implementation, the capacitances C2 and C3 were not modified, but the discharge path resistances Rcathode, Rmesh through the impedance match 155 and the D.C. supply 160, respectively, were selected so that the discharge resistance for the chucking electrode, Rmesh, was on the order of about 1% of the discharge resistance for the cathode, Rcathode. For example, Rmesh, the D.C. resistance to ground for the chucking electrode 110 through the D.C. supply 160 was 1 megOhm, while Rcathode, the D.C. resistance to ground for the cathode 105 through the impedance match 155 was 100 megOhms. These choices were realized by adjusting the circuit designs of the D.C. supply 160 and of the impedance match 155 using conventional techniques well-known in the art.

Figure 8:
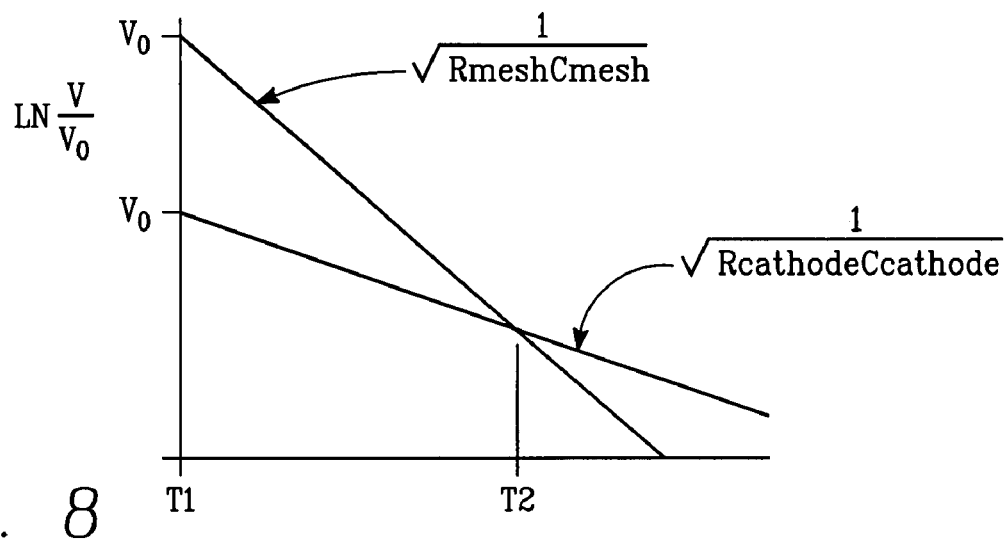
FIG. 8 depicts the slopes of the voltage decay on the cathode and chucking electrode after power-off and before wafer de-chucking.

The decay and cross-over of the mesh and cathode voltages is depicted in the log scale graph of FIG. 8. Each of the two electrode voltages V(t) is a function of time starts out at time T1 (power off) at an initial voltage $V_0$ and decays over time in accordance with the well-known relationship $V(t)=V_0(1-e^{-t/RC})$. In the case of the cathode voltage, $V_0$ is the initial cathode voltage at time T1, R is the D.C. resistance to ground through the impedance match and C is the cathode capacitance C3. In the case of the chucking electrode voltage, $V_0$ is the initial chucking electrode voltage at time T1, R is the D.C. resistance to ground through the D.C. power supply 160 and C is the chucking electrode-to-cathode capacitance C2. In the log scale of FIG. 8, the decay behaviors of the two voltages are straight lines whose slopes are given by $(RC)^{-1}$.

At the instant in time, T2, when the two electrode voltages cross over one another, the residual electrostatic clamping force on the wafer 130 is minimum (or possibly zero), and the lift pins 135 should be moved to lift the wafer 130 off the ESC 100 at that instant. Of course, the interval between times T1 and T2 is generally unknown or can only be predicted with difficulty. Therefore, in one embodiment, means is provided for sensing in real time the occurrence of the crossover between the two decaying electrode voltages of FIG. 7. For this purpose, a chucking electrode voltage sensor 210 monitors the mesh voltage after time T1 while a cathode voltage sensor 220 monitors the cathode voltage after time T1. In one embodiment, both sensors 210, 220 measure voltage relative to ground. The output of the two sensors 210, 220 over time corresponds to the two curves in the graph of FIG. 7. A comparator 230 constantly compares the outputs of the two sensors 210, 220, and senses the occurrence of the cross-over at time T2 when the outputs are equal. The controller 144 is programmed to command the lift servo 142 to lift the wafer 130 up from the ESC 100 the instant the comparator 230 senses an equality between the outputs of the two sensors 210, 220. For this purpose, and in order to ensure precise timing of the wafer liftoff, before time T2 the lift pins 135 are raised so as to contact the wafer 130 but not lift it off the ESC 100. Then, when the lift pins 135 are further moved up at time T2, the wafer is lifted off the ESC 100 at that precise instant, ensuring the minimum residual electrostatic clamping force exists at the time of wafer de-chucking.

The foregoing embodiment is ideal for retrofitting existing plasma reactors, because this embodiment achieves the minimum residual electrostatic clamping force at the time of wafer de-chucking or lift-off without reference to any prior knowledge of characteristics of the ESC or plasma chamber design. What is required is that the D.C. resistances to ground provided through the D.C. voltage supply 160 and the RF impedance match 155 be adjusted so that the electrode (e.g., the chucking electrode) having the higher initial voltage at time T1 has a faster discharge rate than the electrode (e.g., the cathode) having the lesser initial voltage. This feature can be easily retrofitted into a typical plasma reactor already deployed in commercial use. For a non-typical chamber in which the relationship of the initial electrode voltages is reversed (i.e., the initial cathode voltage at time T1 is greater than the chucking electrode voltage at time T1), the discharge characteristics would likewise be reversed. Specifically, the cathode electrode 105 would have a faster discharge rate (smaller RC constant) than the chucking electrode 110.

Figure 9:
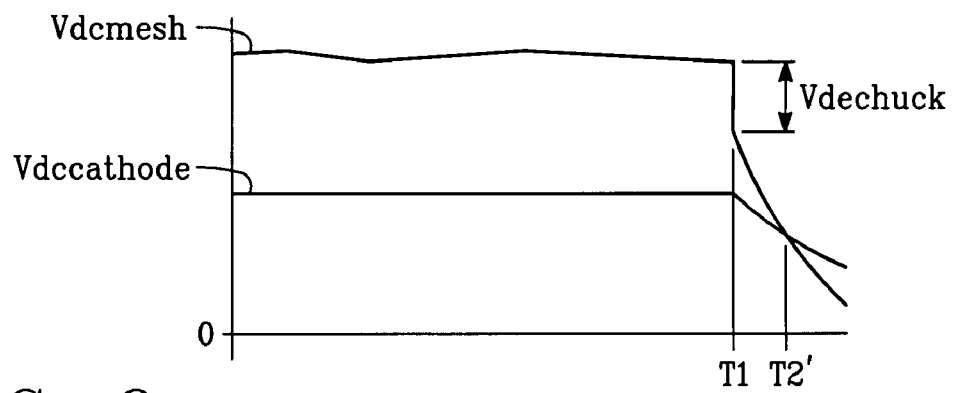
FIG. 9 depicts the time domain waveforms of the cathode and chucking electrode voltages in an alternative mode of operation of the embodiment of FIG. 1.

For greater through-put or better productivity, the interval between time T1 (power off) and time T2 (wafer liftoff) can be shortened. This is accomplished by programming the controller 144 to have the D.C. voltage supply 160 apply a particular constant voltage Vdechuck to the chucking electrode 110 beginning at time T1. The voltage Vdechuck should be of a polarity opposite to that of the D.C. chucking voltage that was applied during plasma processing, and of a magnitude that is smaller than (e.g., a fraction of) the D.C. chucking voltage. This approach is illustrated in the timing diagram of FIG. 9, in which a positive D.C. chucking voltage was applied during plasma processing from time T0 to time T1. Thereafter, at time T1, a negative voltage Vdechuck is applied that, as can be seen in FIG. 9, moves the initial chucking electrode voltage closer to the initial cathode voltage. This change shortens the interval between times T1 and T2. In the example of FIG. 9, the magnitude of Vdechuck is limited so that the chucking electrode voltage is moved about halfway from its initial value toward the initial cathode voltage. This limitation is important in order to avoid an over-correction at time T1 in which the initial mesh voltage is driven below the initial cathode voltage. In one embodiment, the voltage Vdechuck applied by the D.C. voltage supply beginning at time T1 to the chucking electrode 160 is of the opposite polarity and about one half the magnitude of the D.C. chucking voltage applied during plasma processing prior to time T1. Comparing in the qualitative examples of FIGS. 7 and 9, the delay from time T1 (power off) to time T2 (wafer dechuck) is greatly reduced. This reduction may be as much as a factor of two, for example.

Figure 10:
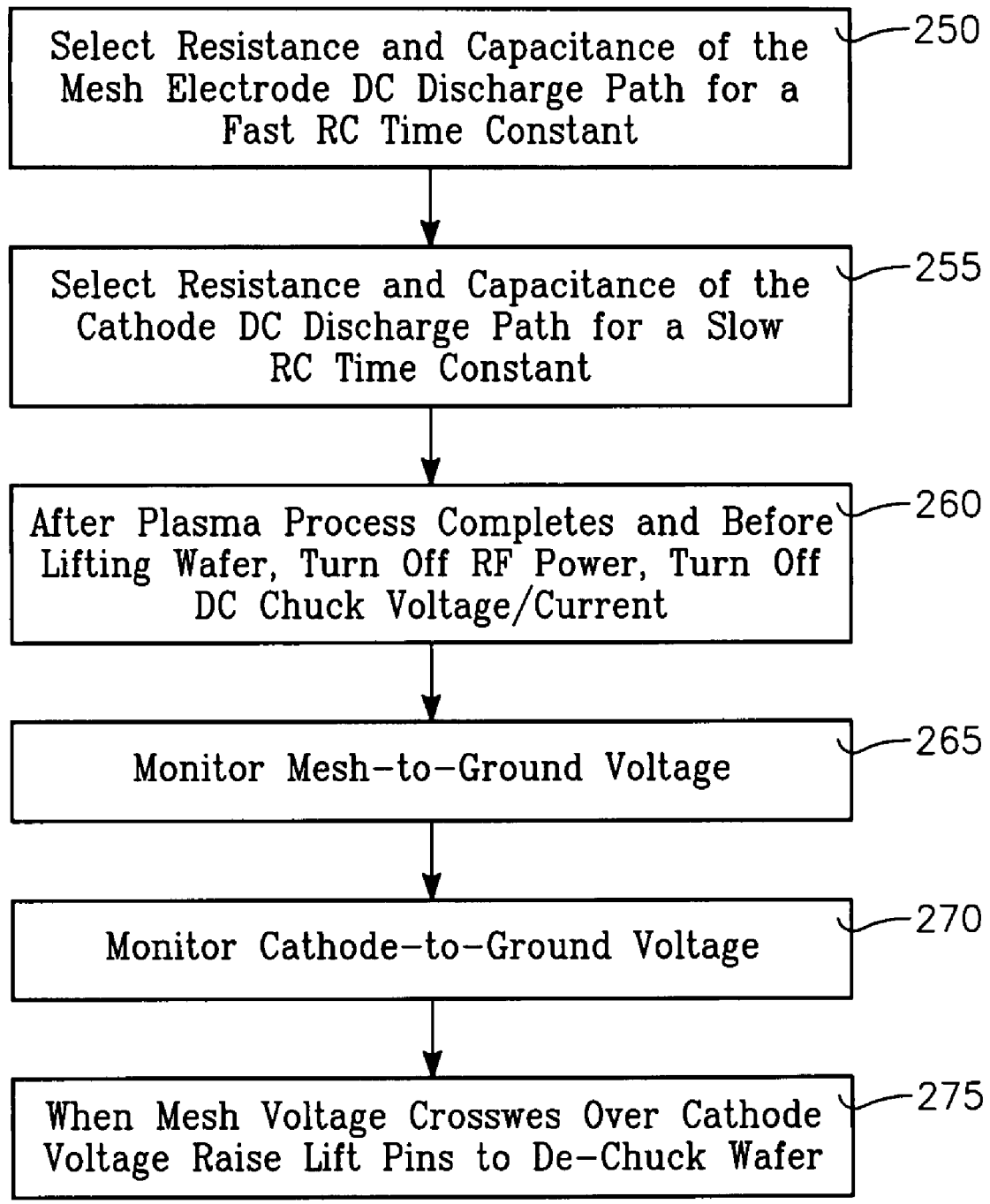
FIG. 10 depicts a method in accordance with one embodiment.

FIG. 10 depicts a method in accordance with one embodiment. The first step is to select a resistance Rmesh of the chucking electrode D.C. discharge path and capacitance C2 of the chucking electrode 110 (block 250 of FIG. 10). Also, a selection is made of the resistance Rcathode of the cathode D.C. discharge path and capacitance C3 of the cathode 105 (block 255 of FIG. 10). These selections are made to provide a faster RC decay time (smaller value of RC) for the electrode that will have the largest voltage at time T1 when RF and D.C. power is turned off. In the embodiments disclosed in this specification it is the chucking electrode 110 that has the largest initial voltage at power off (time T1) and therefore requires the faster discharge path (smaller value of RC). A wafer is placed on the ESC 100 and plasma processing is carried out, during which RF power is applied (e.g., to the cathode 105) and a D.C. chucking voltage is applied to the chucking electrode 110. After completion of plasma processing (at time T1), but before the wafer is lifted from the ESC, the RF power generators 150, 190 are disconnected or turned off and the D.C. supply 160 is turned off (block 260 of FIG. 10). In an alternative embodiment, at this step the output of the D.C. power supply 160 is switched to an opposite polarity and a smaller magnitude (e.g., a fraction of the chucking voltage applied during plasma processing). Beginning at power-off (time T1), the chucking electrode voltage is monitored (block 265 of FIG. 10) and the cathode voltage is monitored (block 270 of FIG. 10). When the two voltages being monitored cross over one another (become equal for an instant in time), the lift pins are raised to instantly lift off the wafer from the ESC (block 275 of FIG. 10). For this purpose, the lift pin 135 may have been previously raised into contact with the wafer backside to ensure immediate lift off of the wafer upon lift pin actuation at time T2 (cross over of the two electrode voltages).

In one embodiment, the difference between the RC time constants of the cathode 105 and the chucking electrode 110 may be sufficiently great to realize crossover of their voltages during the discharge step very quickly, so as to minimize the time delay between T1 and T2, to ensure a minimum delay between plasma process complete and wafer dechucking. The difference between the two RC time constants may be such that the delay from time T1 (plasma process termination and discharge initiation) to time T2 (wafer dechucking) is on the order of minutes or less than a minute, or less than one second or less than a tenth of one second, for example.

In the foregoing examples, the D.C. chucking voltage applied by the D.C. supply 160 to the chucking electrode 110 was a positive voltage. However, the chucking voltage may instead be a negative voltage. In such a case, if a dechucking voltage were applied in order to shorten the waiting interval between times T1 and T2, then the dechucking voltage would be a positive voltage. Different effects are obtained depending upon the polarity of the chucking voltage. For example, use of a positive D.C. chucking voltage during wafer processing (from time 0 to time T1) tends to wear or strain grounded conductive elements in the chamber, but puts little wear or strain on floating or RF-hot components, such as the wafer. Use of a negative D.C. chucking voltage during wafer processing tends to strain RF-hot components in the chamber, such as the wafer. The chucking voltage may be a positive or negative voltage between, typically but not necessarily, 300 VDC and 1000 VDC. The de-chucking voltage (if one is employed) may be between zero and 100 volts of a polarity opposite to that of the chucking voltage, and more typically between about 30 and 50 VDC. For retrofitting an existing reactor in the field, it is more simple and reliable to not apply a dechucking voltage.

While the foregoing is directed to embodiments of the invention, other and further embodiments of the invention may be devised without departing from the basic scope thereof, and the scope thereof is determined by the claims that follow.

What is claimed is:

1. A reactor for processing a workpiece, comprising:
a vacuum chamber including an RF grounded chamber wall;
an electrostatic chuck provided in said chamber and comprising:
(a) a cathode electrode insulated from ground and a chucking electrode overlying and insulated from said cathode electrode;
(b) a dielectric layer overlying said chucking electrode, said dielectric layer having a top surface for supporting a workpiece to be processed; and
(c) a lift pin apparatus;
a D.C. chucking voltage supply coupled to said chucking electrode and an RF impedance match and an RF power generator coupled through said RF impedance match to said cathode electrode;
a voltage sensing apparatus coupled to said chucking electrode and to said cathode electrode; and
a controller programmed to enable said lift pin apparatus whenever said voltage sensing apparatus detects equal voltages simultaneously on said chucking and cathode electrodes.

2. The reactor of claim 1 further comprising:
a first D.C. discharge path having a first resistance through said D.C. chucking voltage supply from said chucking electrode to ground; and
a second D.C. discharge path having a second resistance through said RF impedance match from said cathode electrode to ground, said first and second resistances providing unequal electrical discharge time constants in said first and second D.C. discharge paths.

3. The reactor of claim 2 wherein chucking electrode is positioned closer to a plasma in said chamber than said cathode electrode, and wherein said first resistance is less than said second resistance.

4. The reactor of claim 3 wherein said first resistance is less than said second resistance by about a factor of one hundred.

5. The reactor of claim 3 wherein a product of said first resistance and a capacitance of said chucking electrode is less than a product of said second resistance and a capacitance of said cathode electrode.

6. The reactor of claim 1 wherein said voltage sensing apparatus is referenced to RF ground.

7. The reactor of claim 1 wherein said dielectric layer has a resistance on the order of 30 megOhms.

8. The reactor of claim 1 further comprising:
a sensor coupled to said impedance match;
a bias voltage measurement processor responsive to said sensor;
a feedback controller controlling said D.C. supply in response to said processor.

9. The reactor of claim 8 wherein said feedback controller is programmed to change an output voltage of said D.C. supply in response to changes in bias voltage on said chucking electrode.

10. The reactor of claim 1 wherein said lift pin apparatus is electrically connected to said cathode electrode.

11. A reactor for processing a workpiece, comprising:
a vacuum chamber including an RF grounded chamber wall;
an electrostatic chuck provided in said chamber and comprising:
a cathode electrode and a chucking electrode overlying and insulated from said cathode electrode;

a dielectric layer overlying said chucking electrode, said dielectric layer having a top surface for supporting a workpiece to be processed; and a lift pin apparatus;

a D.C. chucking voltage supply coupled to said chucking electrode and an RF impedance match and an RF power generator coupled through said RF impedance match to said cathode electrode;

a first D.C. discharge path having a first resistance through said D.C. chucking voltage supply from said chucking electrode to ground; and a second D.C. discharge path having a second resistance through said RF impedance match from said cathode electrode to ground, said first and second resistances providing unequal electrical discharge time constants in said first and second D.C. discharge paths.

12. The reactor of claim 11 wherein chucking electrode is positioned closer to a plasma in said chamber than said cathode electrode, and wherein said first resistance is less than said second resistance.

13. The reactor of claim 12 wherein said first resistance is less than said second resistance by about a factor of one hundred.

14. The reactor of claim 12 wherein a product of said first resistance and a capacitance of said chucking electrode is less than a product of said second resistance and a capacitance of said cathode electrode.

15. The reactor of claim 11 wherein said voltage sensing apparatus is referenced to RF ground.

16. The reactor of claim 11 wherein said dielectric layer has a resistance on the order of 30 megOhms.

17. The reactor of claim 11 further comprising:

a sensor coupled to said impedance match;

a bias voltage measurement processor responsive to said sensor;

a feedback controller controlling said D.C. supply in response to said processor.

18. The reactor of claim 17 wherein said feedback controller is programmed to change an output voltage of said D.C. supply in response to changes in bias voltage on said chucking electrode.

19. The reactor of claim 11 wherein said lift pin apparatus is electrically connected to said cathode electrode.

20. The reactor of claim 1 or 11 further comprising means operable during discharging of said chucking and cathode electrodes for lifting a workpiece from said workpiece support surface upon said cathode and chucking electrode reaching the same electrical potential simultaneously.

* * * * *